US011545528B2

(12) United States Patent
Byun et al.

(10) Patent No.: US 11,545,528 B2
(45) Date of Patent: Jan. 3, 2023

(54) DISPLAY APPARATUS

(71) Applicant: Samsung Display Co., Ltd., Yongin-si (KR)

(72) Inventors: Jinsu Byun, Yongin-si (KR); Woongsik Kim, Yongin-si (KR); Saehee Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 217 days.

(21) Appl. No.: 16/821,879

(22) Filed: Mar. 17, 2020

(65) Prior Publication Data

US 2021/0083012 A1 Mar. 18, 2021

(30) Foreign Application Priority Data

Sep. 16, 2019 (KR) ........................ 10-2019-0113525

(51) Int. Cl.
*H01L 27/32* (2006.01)
*G06F 3/041* (2006.01)
*H01L 51/52* (2006.01)

(52) U.S. Cl.
CPC .......... *H01L 27/323* (2013.01); *G06F 3/0412* (2013.01); *H01L 27/3244* (2013.01); *H01L 51/5253* (2013.01); *H01L 51/5275* (2013.01)

(58) Field of Classification Search
CPC ..................... H01L 27/3244; H01L 51/5253
See application file for complete search history.

(56) References Cited

U.S. PATENT DOCUMENTS

| | | |
|---|---|---|
| 6,072,450 A | 6/2000 | Yamada et al. |
| 7,535,646 B2 | 5/2009 | Chari et al. |
| 8,687,273 B2 | 4/2014 | Fukushima et al. |
| 8,823,254 B2 | 9/2014 | Ohta et al. |
| 8,901,587 B2 | 12/2014 | Ohta |
| 9,142,802 B2 | 9/2015 | Miyamoto et al. |
| 9,318,726 B2 | 4/2016 | Choi et al. |
| 9,368,757 B2 | 6/2016 | Choi et al. |

(Continued)

FOREIGN PATENT DOCUMENTS

| | | |
|---|---|---|
| JP | 2009-110873 | 5/2009 |
| JP | 4933553 | 5/2012 |

(Continued)

*Primary Examiner* — Trang Q Tran
(74) *Attorney, Agent, or Firm* — H.C. Park & Associates, PLC

(57) ABSTRACT

A display apparatus including a substrate including a display area and a non-display area adjacent to the display area, a thin film encapsulation layer disposed on the substrate and including at least one inorganic encapsulation layer and at least one organic encapsulation layer, a touch unit disposed on the thin film encapsulation layer in the display area, and including a first insulating layer and a second insulating layer disposed on the first insulating layer, the second insulating layer having a first opening at least partially exposing the first insulating layer, a first partition wall disposed on the thin film encapsulation layer in the non-display area along a periphery of the display area, and an organic layer covering the touch unit, directly contacting an upper surface of the first insulating layer through the first opening, and extending to the first partition wall.

20 Claims, 12 Drawing Sheets

(56) References Cited

U.S. PATENT DOCUMENTS

| | | |
|---|---|---|
| 9,406,724 B2 | 8/2016 | Choi et al. |
| 9,806,296 B2 | 10/2017 | Kang et al. |
| 10,224,377 B2 | 3/2019 | Park et al. |
| 10,338,449 B2 | 7/2019 | Kang et al. |
| 10,439,165 B2 | 10/2019 | Kim et al. |
| 10,468,626 B2 | 11/2019 | Lee et al. |
| 2012/0104368 A1 | 5/2012 | Isobe et al. |
| 2014/0339509 A1 | 11/2014 | Choi et al. |
| 2015/0333108 A1 | 11/2015 | Miyamoto et al. |
| 2016/0087245 A1 | 3/2016 | Park et al. |
| 2018/0033830 A1 | 2/2018 | Kim et al. |
| 2019/0189731 A1* | 6/2019 | Managaki ............... G06F 3/044 |
| 2019/0198782 A1 | 6/2019 | Kim et al. |
| 2019/0221778 A1 | 7/2019 | Kim et al. |
| 2019/0348476 A1* | 11/2019 | Kato ................... H01L 51/5253 |
| 2020/0019281 A1* | 1/2020 | Miyamoto .......... H01L 27/3276 |

FOREIGN PATENT DOCUMENTS

| | | |
|---|---|---|
| JP | 2012-109214 | 6/2012 |
| JP | 5373054 | 12/2013 |
| JP | 5523354 | 6/2014 |
| KR | 10-2013-0008660 | 1/2013 |
| KR | 10-2014-0135568 | 11/2014 |
| KR | 10-2014-0143916 | 12/2014 |
| KR | 10-2016-0034457 | 3/2016 |
| KR | 10-2016-0049157 | 5/2016 |
| KR | 10-2017-0050139 | 5/2017 |
| KR | 10-2017-0062856 | 6/2017 |
| KR | 10-2018-0005323 | 1/2018 |
| KR | 10-2018-0005327 | 1/2018 |
| KR | 10-2018-0013452 | 2/2018 |
| KR | 10-2018-0014398 | 2/2018 |
| KR | 10-2019-0087689 | 7/2019 |

* cited by examiner

DISPLAY APPARATUS

CROSS-REFERENCE TO RELATED APPLICATION

This application claims priority from and the benefit of Korean Patent Application No. 10-2019-0113525, filed on Sep. 16, 2019, which is hereby incorporated by reference for all purposes as if fully set forth herein.

BACKGROUND

Field

Exemplary embodiments of the invention relate generally to a display device and, more specifically, to a display apparatus capable of providing a high-quality image.

Discussion of the Background

Recently, display apparatuses have been used in various ways. Also, display apparatuses have become thin and light, and thus, are being used in a wide range of technical fields. As display apparatuses are used in various fields, demands for display apparatuses providing a high-quality image have increased.

Among display apparatuses, an organic light-emitting display apparatus has advantages, such as a wide viewing angle, a high contrast ratio, and a rapid response speed, and thus, has been gaining attention as a next-generation display apparatus.

In a display apparatus, various components may be formed over display elements, which emit light of a certain color to provide an image, for protecting the display elements or adding a predetermined function to the display apparatus. However, such components may degrade efficiency of light emitted from each of the display elements.

The above information disclosed in this Background section is only for understanding of the background of the inventive concepts, and, therefore, it may contain information that does not constitute prior art

SUMMARY

Display devices constructed according to exemplary embodiments of the invention are capable of improving light emitting efficiency.

Additional features of the inventive concepts will be set forth in the description which follows, and in part will be apparent from the description, or may be learned by practice of the inventive concepts.

A display apparatus according to an exemplary embodiment includes a substrate including a display area and a non-display area adjacent to the display area, a thin film encapsulation layer disposed on the substrate and including at least one inorganic encapsulation layer and at least one organic encapsulation layer, a touch unit disposed on the thin film encapsulation layer in the display area, and including a first insulating layer and a second insulating layer disposed on the first insulating layer, the second insulating layer having a first opening at least partially exposing the first insulating layer, a first partition wall disposed on the thin film encapsulation layer in the non-display area along a periphery of the display area, and an organic layer covering the touch unit, directly contacting an upper surface of the first insulating layer through the first opening, and extending to the first partition wall.

The second insulating layer may have a first refractive index, and the organic layer may have a second refractive index greater than the first refractive index.

The first insulating layer and the second insulating layer may include an organic material.

The first partition wall may include a first layer disposed on the thin film encapsulation layer and a second layer disposed on the first layer, and the first layer may include the same material as the first insulating layer, and the second layer may include the same material as the second insulating layer.

The display apparatus may further include a second partition wall spaced apart from the first partition wall and disposed between the first partition wall and the display area along the periphery of the display area, and a second opening between the first partition wall and the second partition wall, the second opening exposing at least a portion of an upper surface of the thin film encapsulation layer, in which the organic layer disposed over the non-display area may directly contact the upper surface of the thin film encapsulation layer through the second opening.

The thin film encapsulation layer may include a first inorganic encapsulation layer, an organic encapsulation layer, and a second inorganic encapsulation layer sequentially stacked one over another, the organic layer disposed in the non-display area may directly contact the second inorganic encapsulation layer through the second opening.

An inner side surface of the first opening may have a slope tapered forward with respect to the upper surface of the first insulating layer.

The touch unit may further include a conductive layer comprising sensing electrodes.

The touch unit may further include a third insulating layer disposed directly on the thin film encapsulation layer, and the third insulating layer may extend to the non-display area and be disposed on the thin film encapsulation layer in the non-display area.

The first insulating layer and the second insulating layer may include an organic material, and the third insulating layer may include an inorganic material.

The display apparatus may further include a second partition wall spaced apart from the first partition wall and disposed between the first partition wall and the display area along the periphery of the display area, and a third opening between the first partition wall and the second partition wall, the third opening exposing at least a portion of an upper surface of the third insulating layer.

The organic layer disposed in the non-display area may directly contact the upper surface of the third insulating layer through the third opening.

The touch unit may further include a fourth insulating layer disposed on the third insulating layer, and the fourth insulating layer may extend to the non-display area and be disposed on the third insulating layer in the non-display area.

The first insulating layer and the second insulating layer may include an organic material, and the fourth insulating layer may include an inorganic material.

The display apparatus may further include a second partition wall spaced apart from the first partition wall and disposed between the first partition wall and the display area along the periphery of the display area, and a fourth opening between the first partition wall and the second partition wall, in which the fourth opening may expose at least a portion of an upper surface of the fourth insulating layer.

The organic layer disposed in the non-display area may directly contact the upper surface of the fourth insulating layer through the fourth opening.

A display apparatus according to another exemplary embodiment includes a substrate including a display area and a non-display area adjacent to the display area, a thin film encapsulation layer disposed on the substrate and including at least one inorganic encapsulation layer and at least one organic encapsulation layer, a touch unit disposed on the thin film encapsulation layer in the display area and including a first insulating layer, a second insulating layer disposed between the first insulating layer and the thin film encapsulation layer, and a third insulating layer disposed between the first insulating layer and the second insulating layer, a first partition wall disposed on the thin film encapsulation layer in the non-display area along a periphery of the display area, and an organic layer covering the touch unit and extending to the first partition wall, in which the first insulating layer includes a first portion having a first height from an upper surface of the third insulating layer and a second portion having a second height greater than the first height from the upper surface of the third insulating layer.

The second insulating layer and the third insulating layer may extend to the non-display area, and the first insulating layer may include an organic material, and the third insulating layer may include an inorganic material.

The first partition wall may include a first layer disposed on the third insulating layer and extending to the non-display area, the first layer may include the same material as the first insulating layer, and the first partition wall may have a third height from the upper surface of the third insulating layer, the third height being the same as the second height.

The first portion may correspond to an emission area.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
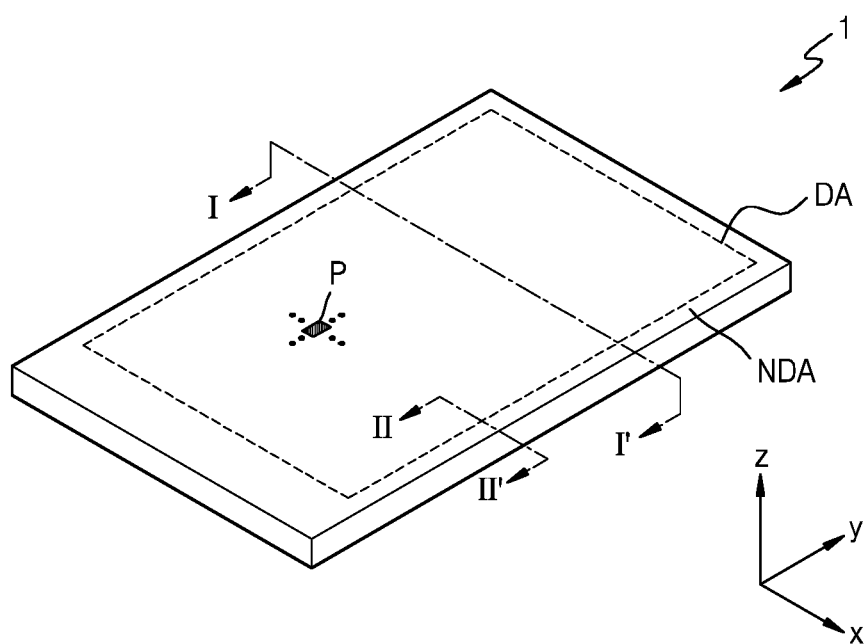
FIG. 1 is a schematic perspective view of a display apparatus according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a schematic perspective view of a display apparatus 1 according to an exemplary embodiment.

Referring to FIG. 1, the display apparatus 1 may include a display area DA and a non-display area NDA adjacent to the display area DA. The non-display area NDA may surround the display area DA. The display apparatus 1 may provide an image by using light emitted from a plurality of pixels P arranged over the display area DA, and the non-display area NDA may be an area where no image is displayed.

Hereinafter, the display apparatus 1 according to an exemplary embodiments will be described with reference to an organic light-emitting display apparatus. However, the inventive concepts are not limited thereto. In some exemplary embodiments, the display apparatus 1 may be an inorganic light-emitting display apparatus (or an inorganic EL display apparatus) or a quantum dot light-emitting display apparatus. For example, an emission layer of a display element included in the display apparatus 1 may include at least one of an organic material, an inorganic material, quantum dots, an organic material and quantum dots, and an inorganic material and quantum dots.

In addition, although FIG. 1 shows that the display apparatus 1 includes a flat display surface, the inventive concepts are not limited thereto. In some exemplary embodiments, the display apparatus 1 may include a three-dimensional display surface or a curved display surface.

When the display apparatus 1 includes a three-dimensional display surface, the display apparatus 1 may include a plurality of display areas indicating different directions from one another, and may include a polygonal prism type display surface, for example. In an exemplary embodiment, when the display apparatus 1 includes a curved display surface, the display apparatus 1 may be realized in various forms, such as flexible, foldable, or rollable display apparatuses.

In FIG. 1, the display apparatus 1 is exemplarily illustrated as being applied to a cellular phone. Although not shown, electronic modules mounted on the mainboard, a camera module, a power module, and the like may be arranged in a bracket and/or a case together with the display apparatus 1 to form a cellular phone. The display apparatus 1 described herein may be applied to large electronic apparatuses, such as a television and a monitor, and small and medium electronic apparatuses, such as a tablet, car navigation, a game console, and a smartwatch.

FIG. 1 shows that the display area DA of the display apparatus 1 has substantially a rectangular shape, but in some exemplary embodiments, the display area DA may have substantially a circle, an oval, or a polygonal shape, such as a triangle or a pentagon.

Figure 2:
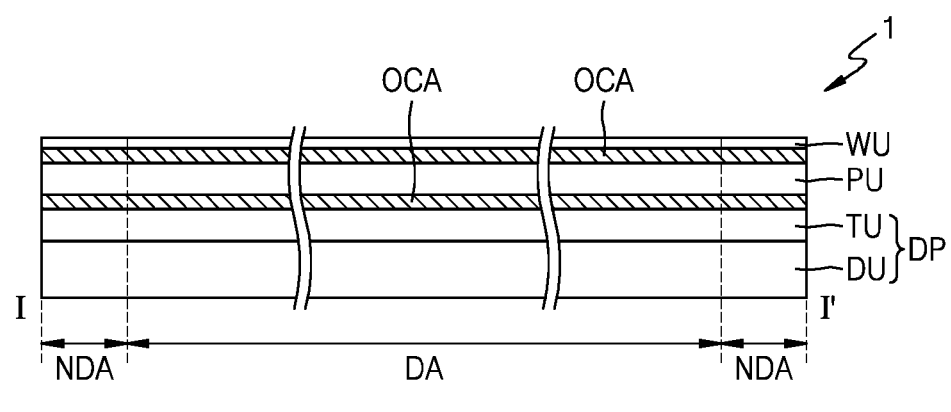
FIG. 2 is a schematic cross-sectional view of the display apparatus of FIG. 1.

FIG. 2 is a schematic cross-sectional view of the display apparatus 1 of FIG. 1. FIG. 2 is briefly given to explain a stacking relationship of a functional panel and/or functional units constituting the display apparatus 1.

Referring to FIG. 2, the display apparatus 1 according to an exemplary embodiment may include a display unit DU (e.g., a display layer), a touch unit TU, a polarization unit PU, and a window unit WU. At least some components among the display unit DU, the touch unit TU, the polarization unit PU, and the window unit WU may be formed by consecutive processes, or may be combined with each other through an adhesive member. FIG. 2 exemplarily shows an optically clear adhesive OCA as the adhesive member. The adhesive member described below may include an ordinary adhesive or pressure-sensitive adhesive. In some exemplary embodiments, the polarization unit PU and the window unit WU may be substituted with other components or may be omitted.

The touch unit TU is directly arranged on the display unit DU. As used herein, the phrase "a component B is directly arranged on a component A" may refer to that no adhesive layer/adhesive member is arranged between the component A and the component B. For example, after a component A is formed, a component B may be formed on a base surface provided by the component A through consecutive processes.

The display unit DU and the touch unit TU directly arranged on the display unit DU may be defined as a display panel DP. In an exemplary embodiment, as shown in FIG. 2, the optically clear adhesive OCA may be arranged between the display panel DP and the polarization unit PU, and between the polarization unit PU and the window unit WU.

The display unit DU generates an image, and the touch unit TU obtains coordinate information of an external input, such as a touch event. In some exemplary embodiments, the display panel DP may further include a protection member on a lower surface of the display unit DU. The protection member and the display unit DU may be combined with each other through an adhesive member.

The polarization unit PU may decrease reflectance of external light incident on an upper side of the window unit WU. The polarization unit PU according to an exemplary embodiment may include a phase retarder and a polarizer. The phase retarder may be a film type or a liquid crystal coating type, and may include a λ/2 phase retarder and/or a λ/4 phase retarder. The polarizer may also be a film type or a liquid crystal coating type. The film type may include an elongation-type synthetic resin film, and the liquid crystal coating type may include liquid crystals arranged in a predetermined arrangement. The phase retarder and the polarizer may further include a protection film. The phase retarder and the polarizer, or the protection film may be defined as a base layer of the polarization unit PU.

Hereinafter, a structure of the display unit DU and the touch unit TU will be described in detail.

Figure 3:
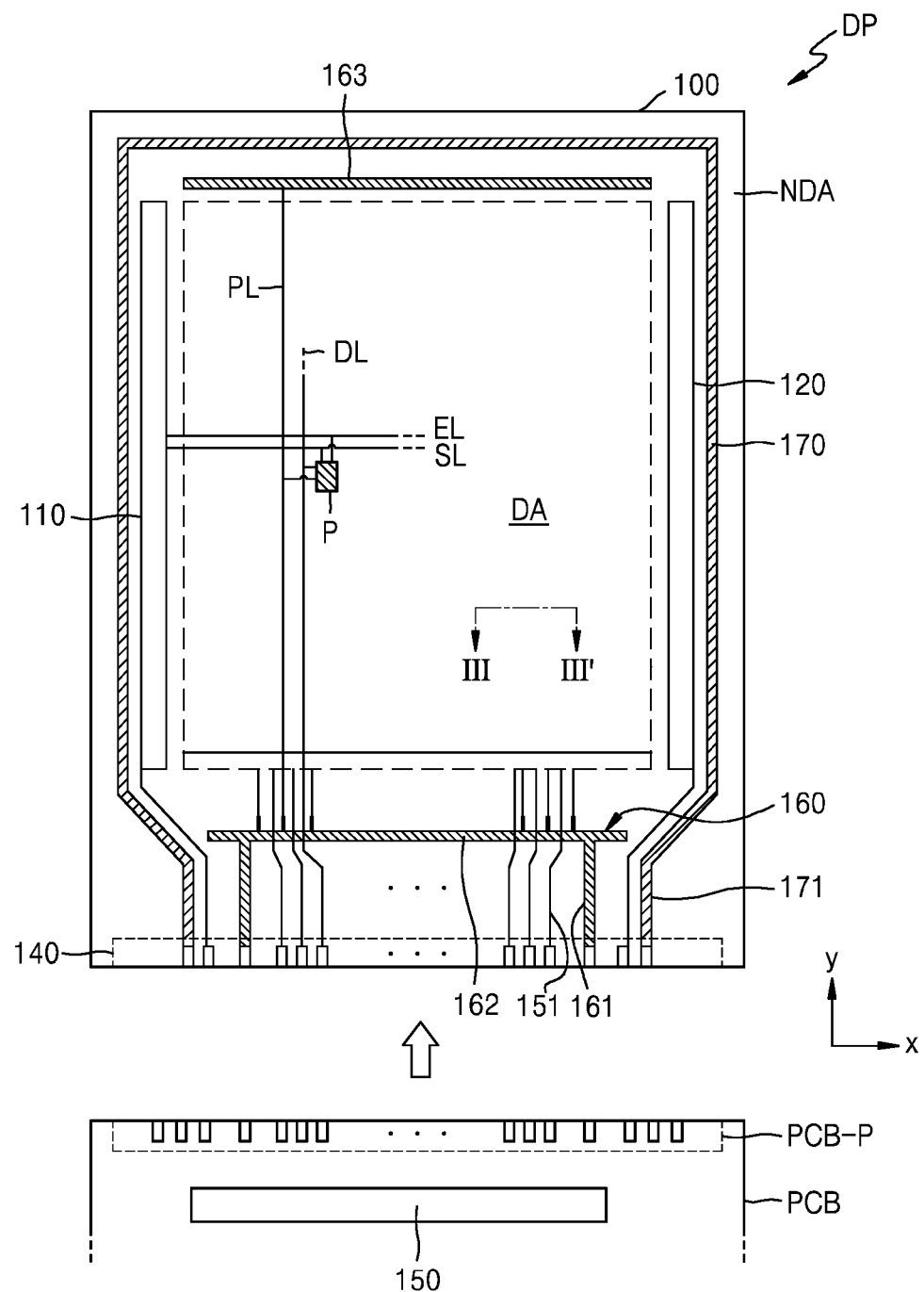
FIG. 3 is a schematic plan view of a portion of a display apparatus according to an exemplary embodiment

FIG. 3 is a schematic plan view of a portion of a display apparatus according to an exemplary embodiment.

Referring to FIG. 3, the display panel DP includes the plurality of pixels P arranged over the display area DA. The plurality of pixels P may each include a display element, such as an organic light-emitting diode OLED. Each pixel P may emit, for example, red, green, blue, or white light, through the organic light-emitting diode OLED. A pixel P may emit one of red light, green light, blue light, and white light as described above. The display area DA may be covered by a thin film encapsulation layer TFE (see FIG. 5), and be protected from external air or moisture.

Each pixel P may be electrically connected to peripheral circuits arranged over the non-display area NDA. A first scan driving circuit 110, a second scan driving circuit 120, a pad portion 140, a data driving circuit 150, a first power supply wire 160, and a second power supply wire 170 may be arranged over the non-display area NDA.

The first scan driving circuit 110 may provide a scan signal to each pixel P via a scan line SL. The first scan driving circuit 110 may provide an emission control signal to each pixel P via an emission control line EL. The second scan driving circuit 120 may be substantially parallel to the first scan driving circuit 110 with the display area DA therebetween. Some of the pixels P arranged over the display area DA may be electrically connected to the first scan driving circuit 110, and the others may be connected to the second scan driving circuit 120. In some exemplary embodiments, the second scan driving circuit 120 may be omitted.

The pad portion 140 may be arranged on a side of a substrate 100. The pad portion 140 may not be covered by an insulating layer, and may be exposed and electrically connected to a printed circuit board PCB. A pad portion PCB-P of the printed circuit board PCB may be electrically connected to the pad portion 140 of the display apparatus 1. The printed circuit board PCB may transmit a signal or power of a controller to the display apparatus 1.

Control signals generated from the controller may be transmitted to the first and second scan driving circuits 110 and 120, respectively, through the printed circuit board PCB. The controller may provide first and second power voltages ELVDD and ELVSS (see FIG. 4) to the first and second power supply wires 160 and 170, respectively, via first and second connection wires 161 and 171. The first power voltage ELVDD may be provided to each pixel P via a driving voltage line PL connected to the first power supply wire 160, and the second power voltage ELVSS may be provided to an opposite electrode of each pixel P connected to the second power supply wire 170.

The data driving circuit 150 may be electrically connected to a data line DL. A data signal of the data driving circuit 150 may be provided to each pixel P via a connection wire 151 connected to the pad portion 140 and the data line DL connected to the connection wire 151. Although FIG. 3 shows that the data driving circuit 150 is arranged on the printed circuit board PCB, however, in some exemplary embodiments, the data driving circuit 150 may be arranged on the substrate 100. For example, the data driving circuit 150 may be arranged between the pad portion 140 and the first power supply wire 160.

The first power supply wire 160 may include a first sub-wire 162 and a second sub-wire 163 extending substantially parallel to each other in an x-direction with the display area DA therebetween. The second power supply wire 170 may partially surround the display area DA in a loop having one side open.

Figure 4:
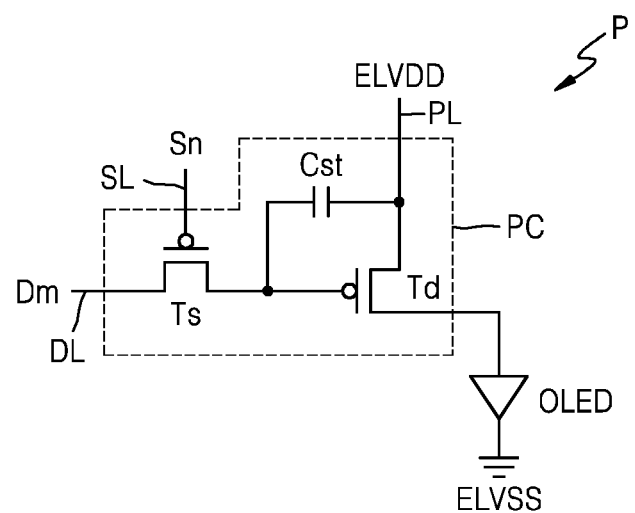
FIG. 4 is an equivalent circuit diagram of a pixel according to an exemplary embodiment.

FIG. 4 is an equivalent circuit diagram of the pixel P, which may be included in a display apparatus according to an exemplary embodiment.

Referring to FIG. 4, each pixel P may include a pixel circuit PC connected to the scan line SL and the data line DL, and the organic light-emitting diode OLED connected to the pixel circuit PC. The pixel circuit PC may include a driving thin film transistor Td, a switching thin film transistor Ts, and a storage capacitor Cst. The switching thin film transistor Ts may be connected to the scan line SL and the data line DL, and may transmit a data signal Dm input via the data line DL to the driving thin film transistor Td according to a scan signal Sn input via the scan line SL.

The storage capacitor Cst may be connected to the switching thin film transistor Ts and the driving voltage line PL, and may store a voltage corresponding to a difference between a voltage received from the switching thin film transistor Ts and the first power voltage ELVDD (or a driving voltage) supplied to the driving voltage line PL.

The driving thin film transistor Td may be connected to the driving voltage line PL and the storage capacitor Cst, and may control a driving current flowing through the organic light-emitting diode OLED from the driving voltage line PL in response to a voltage value stored in the storage capacitor Cst. The organic light-emitting diode OLED may emit light having a brightness that corresponds to the driving current.

Although FIG. 4 shows that the pixel circuit PC includes two thin film transistors and one storage capacitor, however, the inventive concepts are not limited thereto. For example, in some exemplary embodiments, the pixel circuit PC may include seven thin film transistors and one storage capacitor. In other exemplary embodiments, the pixel circuit PC may include two or more storage capacitors.

Figure 5:
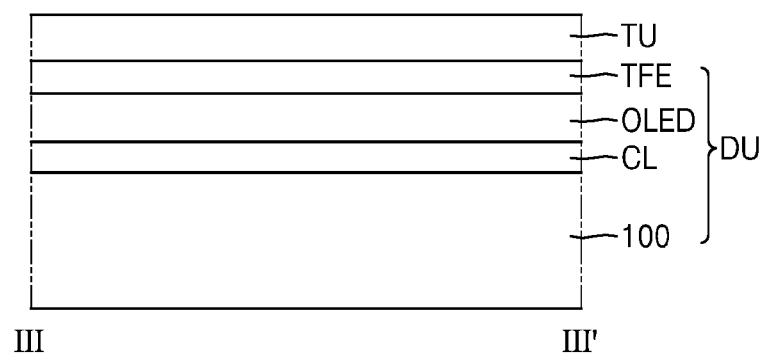
FIG. 5 is a schematic cross-sectional view of a display apparatus according to an exemplary embodiment.
Figure 5:
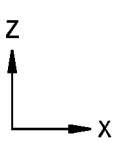

FIG. 5 is a schematic cross-sectional view of a display apparatus according to an exemplary embodiment.

Referring to FIG. 5, the display unit DU may include the substrate 100, a circuit layer CL, the organic light-emitting diode OLED, and the thin film encapsulation layer TFE. The circuit layer CL, the organic light-emitting diode OLED, and the thin film encapsulation layer TFE may be sequentially arranged on the substrate 100 of the display unit DU. The touch unit TU may be directly arranged on the thin film encapsulation layer TFE. The thin film encapsulation layer TFE may include at least one organic encapsulation layer (see FIG. 8), which will be described in more detail below, and thus may, provide a planarized base surface. Accordingly, even when the components of the touch unit TU described below may be formed by consecutive processes, a failure rate during manufacture may be reduced.

Figure 6:
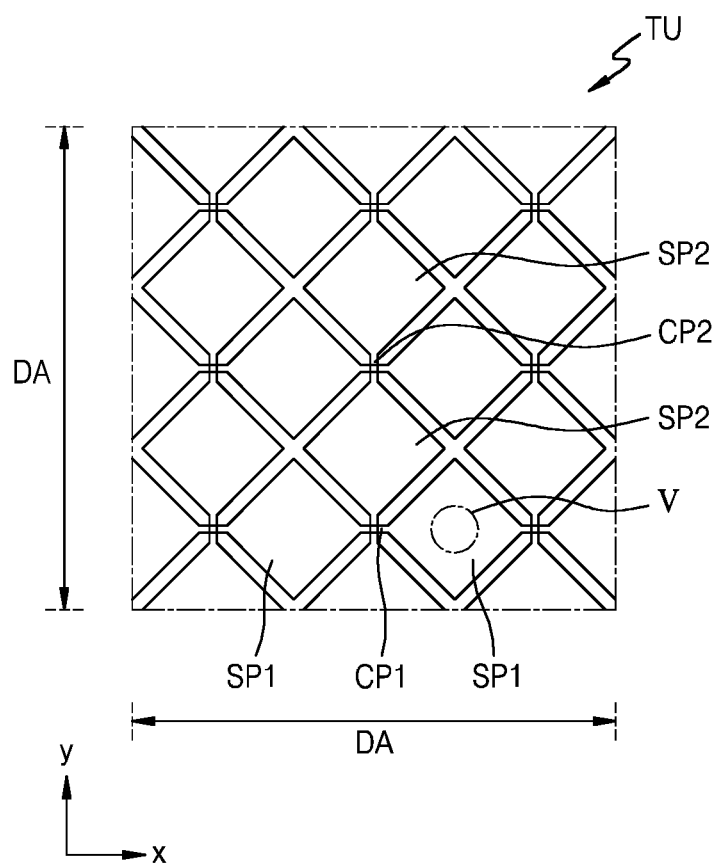
FIG. 6 is a plan view of a touch unit according to an exemplary embodiment.
Figure 7A:
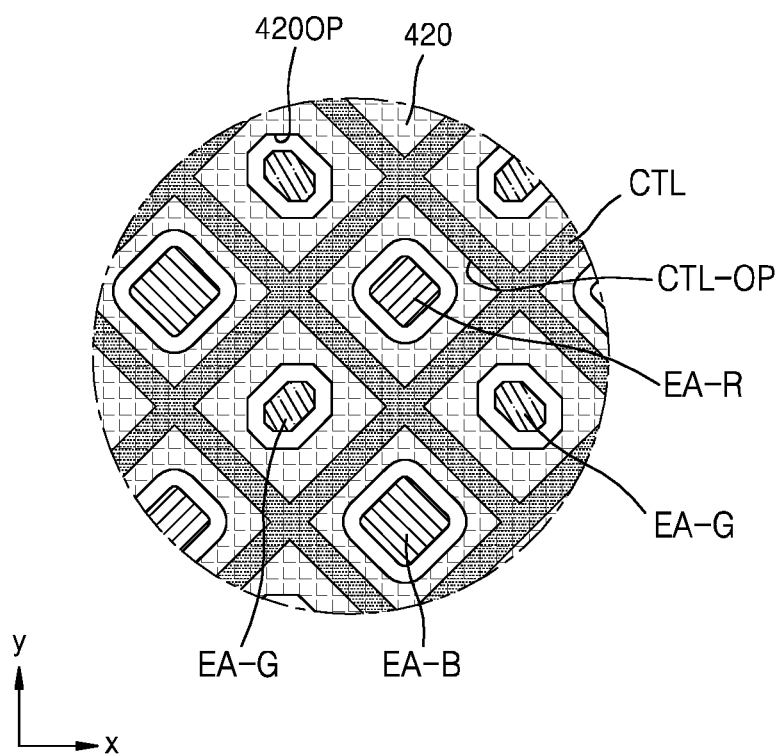
FIGS. 7A and 7B are enlarged plan views of region V of FIG. 6.
Figure 7B:
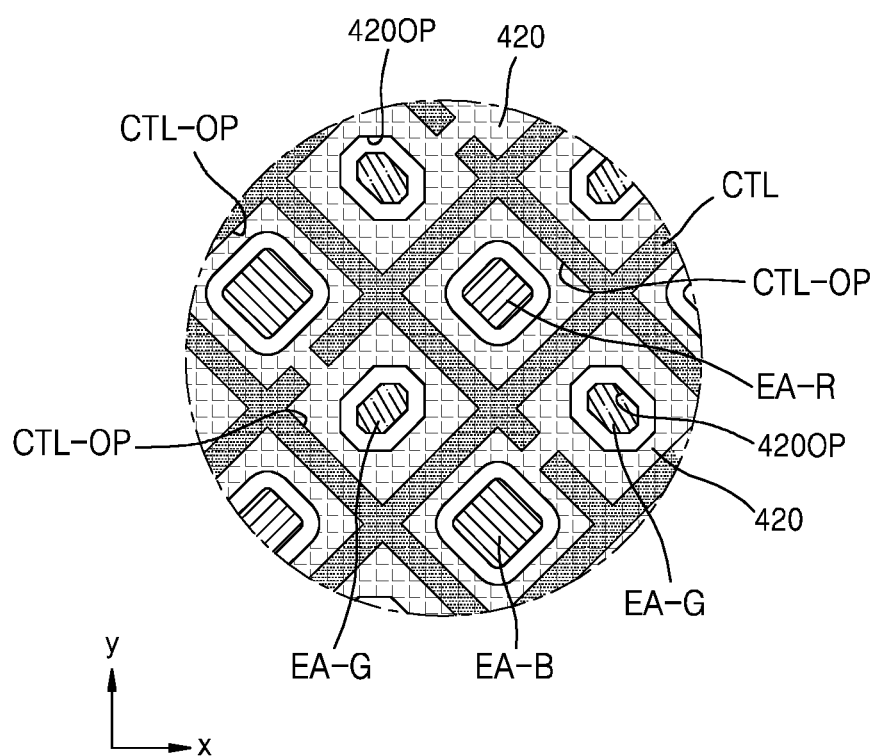

FIG. 6 is a plan view of the touch unit TU according to an exemplary embodiment, and FIGS. 7A and 7B are enlarged plan views of region V of FIG. 6.

Referring to FIG. 6, the touch unit TU may include a plurality of first sensing electrodes SP1 arranged in a first direction (e.g. x-direction) and a plurality of second sensing electrodes SP2 arranged in a second direction (e.g. y-direction) crossing the first direction. The first direction and the second direction may perpendicularly cross each other. Neighboring first sensing electrodes SP1 may be electrically connected to each other through a first connection electrode CP1, and neighboring second sensing electrodes SP2 may be electrically connected to each other through a second connection electrode CP2.

The first sensing electrodes SP1 and the second sensing electrodes SP2 may include a conductive layer, and the conductive layer may include a metal layer or a transparent conductive layer. The metal layer may include molybdenum (Mo), magnesium (Mg), silver (Ag), titanium (Ti), copper (Cu), aluminum (Al), and an alloy thereof. The transparent conductive layer may include transparent conductive oxide such as indium tin oxide (ITO), indium zinc oxide (IZO), zinc oxide (ZnO), indium tin zinc oxide (ITZO), etc. In addition, the transparent conductive layer may include a conductive polymer, such as PEDOT, metal nanowire, carbon nanotube, graphene, etc. First connection electrodes CP1 and second connection electrodes CP2 may also each include a conductive layer, such as a metal layer or a transparent conductive layer, as described above.

The sensing electrodes and the connection electrodes may each have a mesh structure including a plurality of openings. For example, as shown in FIGS. 7A and 7B, each of the first sensing electrodes SP1 may be formed in a conductive layer CTL. The conductive layer CTL may include a plurality of openings CTL-OP, and body portions at least partially surrounding each of the openings CTL-OP and defining each of the openings CTL-OP. The body portions may be connected to each other to form a mesh structure. Likewise, each of the second sensing electrodes SP2, each of the first connection electrodes CP1, and each of the second connection electrodes CP2 may also have a mesh structure. The conductive layer CTL may include a first sub-conductive layer CTL1 (of FIG. 8) and a second sub-conductive layer CTL2 (of FIG. 8).

Each opening CTL-OP of the conductive layer CTL may overlap an emission area of each pixel. For example, each of the openings CTL-OP may overlap an emission area EA-R where red light is emitted, an emission area EA-G where green light is emitted, or an emission area EA-B where blue light is emitted.

As shown in FIG. 7A, each of the openings CTL-OP may be surrounded by a body portion of the conductive layer CTL, and thus, may not be spatially connected to each other. Alternatively, at least one opening CTL-OP among the plurality of openings CTL-OP may be partially surrounded by a body portion of the conductive layer CTL, and in this case, as shown in FIG. 7B, neighboring openings CTL-OP may be spatially connected to each other.

The touch unit TU may include a first insulating layer and a second insulating layer 420 arranged on and/or under the conductive layer CTL. FIGS. 7A and 7B show the second insulating layer 420 overlapping the conductive layer CTL. The second insulating layer 420 may include openings 4200P each corresponding to an emission area. The openings 4200P in the second insulating layer 420 may be formed by removing portions of the second insulating layer 420 through exposure and development processes. The openings 4200P may be formed by penetrating through an upper surface and a bottom surface of the second insulating layer 420. In a plan view, the openings 4200P may each have a shape similar to that of an emission area corresponding to each of the openings 4200P. For example, the red and blue emission areas EA-R and EA-B and the openings 4200P corresponding to the red and blue emission areas EA-R and EA-B may each have substantially a quadrilateral shape, and the green emission area EA-G and the openings 4200P corresponding to the green emission area EA-G may each have substantially a hexagonal or octagonal shape. As used herein, the term "correspond" may encompass the term "overlap". In some exemplary embodiments, in a plan view, the openings 4200P may have a shape different from that of an emission area. For example, the red, blue, and green emission areas EA-R, EA-B, and EA-G may have substantially a polygonal shape, whereas the openings 4200P may each have substantially a circular shape.

Figure 8:
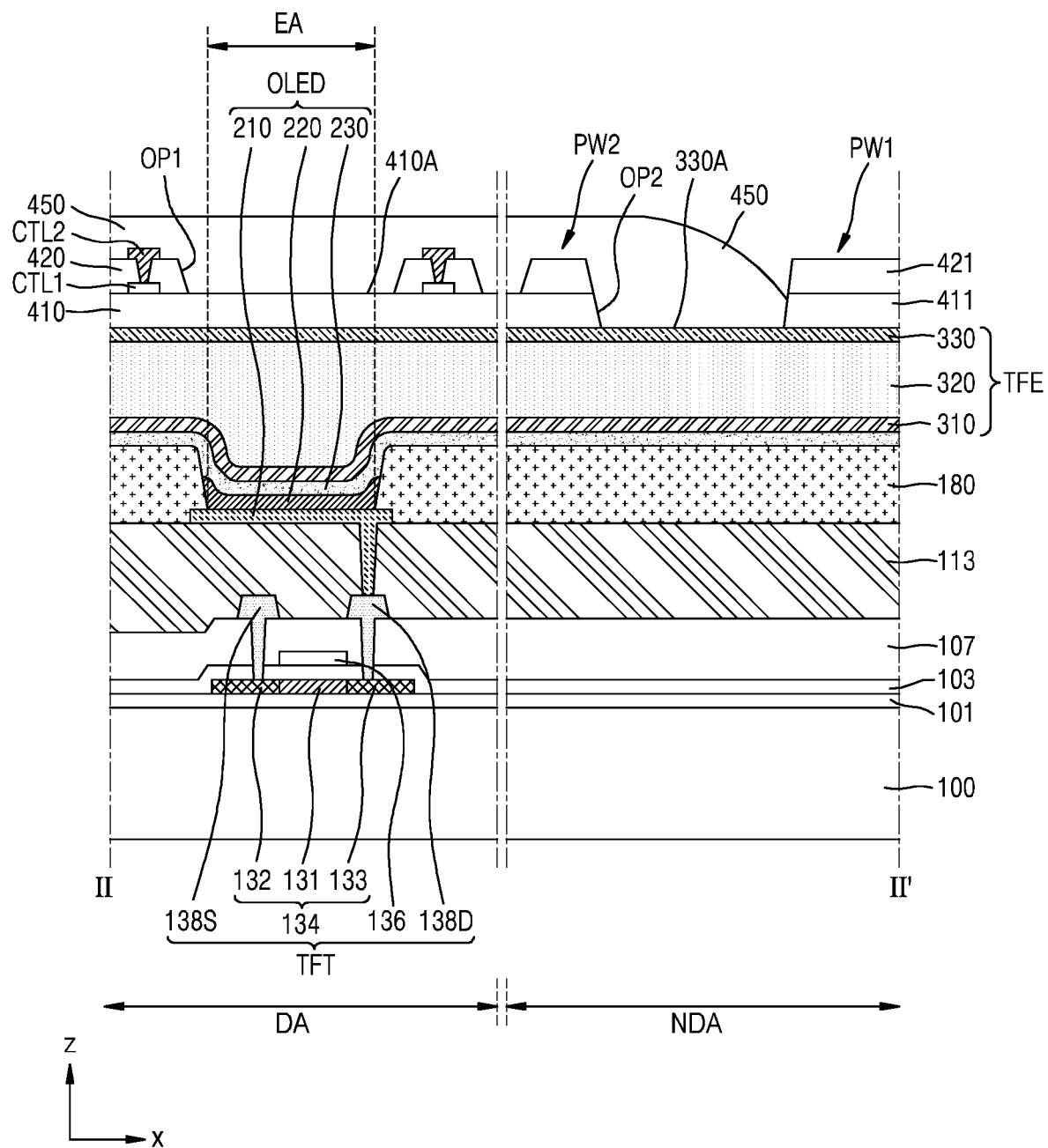
FIG. 8 is a cross-sectional view of a display apparatus according to an exemplary embodiment.

FIG. 8 is a cross-sectional view of a display apparatus according to an exemplary embodiment.

Referring to FIG. 8, the substrate 100 may include the display area DA and the non-display area NDA adjacent to the display area DA. The substrate 100 may include glass or polymer resin. The polymer resin may include polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 including polymer resin may be flexible, rollable, or bendable. The substrate 100 may have a multilayer structure including a layer including the above polymer resin and an inorganic layer.

A buffer layer 101 may be disposed on the substrate 100 to suppress or prevent penetration of foreign materials, moisture, or external air from the bottom of the substrate 100, and may provide a flat surface on the substrate 100. The buffer layer 101 may include an inorganic material, such as oxide or nitride, an organic material, or an organic-inorganic complex material, and may have a single-layer or multilayer structure of an inorganic material and an organic material. In some exemplary embodiments, a barrier layer for preventing penetration of external air may be further included between the substrate 100 and the buffer layer 101.

A thin film transistor TFT provided at a location corresponding to the display area DA and the organic light-emitting diode OLED electrically connected to the thin film transistor TFT may be disposed above the substrate 100.

The thin film transistor TFT may include a semiconductor layer 134 and a gate electrode 136. The semiconductor layer 134 may include, for example, polysilicon. The semiconductor layer 134 may include a channel region 131 overlapping the gate electrode 136, and a source region 132 and a drain region 133 arranged on both sides of the channel region 131, which include impurities having a higher concentration than those of the channel region 131. In this case, the impurities may include N-type impurities or P-type impurities. The source region 132 and the drain region 133 may be electrically connected to a source electrode 138S and a drain electrode 138D of the thin film transistor TFT.

The semiconductor layer 134 may include an oxide semiconductor and/or a silicon semiconductor. When the semiconductor layer 134 includes an oxide semiconductor, the semiconductor layer 134 may include, for example, oxide of at least one of indium (In), gallium (Ga), tin (Sn), zirconium (Zr), vanadium (V), hafnium (Hf), cadmium (Cd), germanium (Ge), chromium (Cr), titanium (Tl), and zinc (Zn). For example, the semiconductor layer 134 may be InSnZnO (ITZO), InGaZnO (IGZO), etc. When the semiconductor layer 134 includes a silicon semiconductor, the semiconductor layer 134 may include, for example, amorphous silicon (a-Si) or low-temperature polycrystalline silicon (LTPS) obtained by crystallizing amorphous silicon (a-Si).

The gate electrode 136 may have a single-layer or multilayer structure including one or more metals of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The gate electrode 136 may be connected to a gate line for applying an electrical signal to the gate electrode 136.

A gate insulating layer 103 may be arranged between the semiconductor layer 134 and the gate electrode 136. The gate insulating layer 103 may include at least one inorganic insulating material selected from the group including silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The gate insulating layer 103 may have a single-layer or multilayer structure including the above inorganic insulating material.

A storage capacitor may be arranged on the gate electrode 136. The storage capacitor may include a lower electrode and an upper electrode, the storage capacitor may overlap the thin film transistor TFT, and the lower electrode of the storage capacitor may be integrally arranged with the gate electrode 136 of the thin film transistor TFT. In some exemplary embodiments, the storage capacitor may not overlap the thin film transistor TFT, and the lower electrode may be an independent component separate from the gate electrode 136 of the thin film transistor TFT.

An interlayer insulating layer 107 may be arranged on the gate electrode 136. The interlayer insulating layer 107 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$), and may have a single-layer or multilayer structure.

The source electrode 138S and the drain electrode 138D may be arranged on the interlayer insulating layer 107. The source electrode 138S and the drain electrode 138D may include various conductive materials. The source electrode 138S and the drain electrode 138D may include titanium or aluminum, and when necessary, may have a multilayer structure. For example, the source electrode 138S and the drain electrode 138D may have a three-layer structure including a titanium layer, an aluminum layer, and a titanium layer.

A planarization insulating layer 113 may be arranged on the thin film transistor TFT. The planarization insulating layer 113 may include, for example, an organic material, such as acrylic, benzocyclobutene (BCB), or hexamethyldisiloxane (HMDSO). Although FIG. 8 shows the planarization insulating layer 113 having a single-layer structure, however, in some exemplary embodiments, the planarization insulating layer 113 may have a multilayer structure.

In the display area DA of the substrate 100, the organic light-emitting diode OLED including a pixel electrode 210, an intermediate layer 220, and an opposite electrode 230 facing the pixel electrode 210 with the intermediate layer 220 therebetween may be disposed on the planarization insulating layer 113.

The pixel electrode 210 may be arranged on the planarization insulating layer 113. The pixel electrode 210 may be arranged for each pixel. Pixel electrodes 210 corresponding to neighboring pixels, respectively, may be spaced apart from each other.

The pixel electrode 210 may include a reflective electrode. In some exemplary embodiments, the pixel electrode 210 may include a reflective film including Ag, Mg, Al, Pt, Pd, Au, Ni, Nd, Ir, Cr, and a compound thereof, and a transparent or semi-transparent electrode layer disposed on the reflective film. The transparent or semi-transparent electrode layer may include at least one of indium tin oxide (ITO), indium zinc oxide (IZO), zinc oxide (ZnO), indium oxide ($In_2O_3$), indium gallium oxide (IGO), and aluminum zinc oxide (AZO). In some exemplary embodiments, the pixel electrode 210 may have a three-layer structure of an ITO layer, an Ag layer, and an ITO layer.

A pixel-defining layer 180 may be arranged on the pixel electrode 210. The pixel-defining layer 180 may include an opening exposing at least a portion of each pixel electrode 210 to define an emission area of a pixel. Also, the pixel-defining layer 180 may increase a distance between the edge of the pixel electrode 210 and the opposite electrode 230 arranged over the pixel electrode 210, and thus, may prevent the occurrence of an arc, etc. over the edge of the pixel electrode 210. The pixel-defining layer 180 may be formed by a method, such as spin coating, using an organic insulating material, such as polyimide, polyamide, acrylic resin, BCB, HMDSO, and phenolic resin, for example.

A spacer may be arranged on the pixel-defining layer 180. The spacer may prevent layers between the substrate 100 and the spacer from being damaged by a mask that is used during a process of forming the intermediate layer 220 described below. The spacer may include the same material as the pixel-defining layer 180.

The intermediate layer 220 may be arranged on the pixel electrode 210 exposed by the pixel-defining layer 180. The intermediate layer 220 may include an emission layer, and may selectively further include functional layers, such as a hole transport layer (HTL), a hole injection layer (HIL), an electron transport layer (ETL), and an electron injection layer (EIL), under and/or on the emission layer.

The emission layer may include an organic material including a fluorescent or phosphorescent material that emits red, green, blue, or white light. The emission layer may include a low-molecular weight organic material or a polymer organic material.

When the emission layer includes a low-molecular weight organic material, the intermediate layer 220 may have a structure, in which an HIL, an HTL, an emission layer (EML), an ETL, an EIL, etc. are stacked in a single or complex structure, and may include various organic materials, including copper phthalocyanine (CuPc), N,N'-Di (naphthalene-1-yl)-N,N'-diphenyl-benzidine (NPB), tris-8-hydroxyquinoline aluminum ($Alq_3$), etc. as a low-molecular weight organic material. Such layers may be formed by vacuum deposition.

When the EML includes a polymer material, the intermediate layer 220 may generally have a structure including an HTL and an EML. The HTL may include poly(3,4-ethylenedioxythiophene (PEDOT), and the EML may include a polymer material, such as a polyphenylene vinylene (PPV)-based material and a polyfluorene-based material. The EML may be formed by screen printing, inkjet printing, laser induced thermal imaging (LITI), etc.

The EML may be arranged for each pixel to correspond to an opening in the pixel-defining layer 180, whereas functional layers, such as an HTL, an HIL, an ETL, and an EIL may each be a common layer integrally formed to cover the entire substrate 100, as the opposite electrode 230, for example, to entirely cover the display area DA of the substrate 100.

The opposite electrode 230 may be arranged on the intermediate layer 220. The opposite electrode 230 may be arranged on the intermediate layer 220 to cover the entire intermediate layer 220. The opposite electrode 230 may include a transparent layer or a semi transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the opposite electrode 230 may further include a layer, such as ITO, IZO, ZnO, or $In_2O_3$, on the transparent layer or the semi transparent layer including the above material. In an exemplary embodiment, the opposite electrode 230 may include silver (Ag), magnesium (Mg), or an alloy of silver (Ag) and magnesium (Mg).

The thin film encapsulation layer TFE may be arranged on the opposite electrode 230, and thus, may protect the organic light-emitting diode OLED from external moisture and oxygen. The thin film encapsulation layer TFE may include at least one organic encapsulation layer and at least one inorganic encapsulation layer.

The thin film encapsulation layer TFE may entirely cover the display area DA, and may extend to the non-display area NDA and partially cover the non-display area NDA. The thin film encapsulation layer TFE may include a first inorganic encapsulation layer 310, a second inorganic encapsulation layer 330 arranged over the first inorganic encapsulation layer 310, and an organic encapsulation layer 320 between the first inorganic encapsulation layer 310 and the second inorganic encapsulation layer 330.

The first inorganic encapsulation layer 310 and the second inorganic encapsulation layer 330 may include one or more inorganic materials of aluminum oxide, titanium oxide, tantalum oxide, hafnium oxide, zinc oxide, silicon oxide, silicon nitride, and silicon oxynitride. The first inorganic encapsulation layer 310 and the second inorganic encapsulation layer 330 may have a single-layer or multilayer structure including the above material. The first inorganic encapsulation layer 310 and the second inorganic encapsulation layer 330 may include the same material as each other, or may include different materials from each other.

Thicknesses of the first inorganic encapsulation layer 310 and the second inorganic encapsulation layer 330 may be different from each other. The first inorganic encapsulation layer 310 may be thicker than the second inorganic encapsulation layer 330. Alternatively, the second inorganic encapsulation layer 330 may be thicker than the first inorganic encapsulation layer 310, or thicknesses of the first inorganic encapsulation layer 310 and the second inorganic encapsulation layer 330 may be the same as each other.

The organic encapsulation layer 320 may include a monomer-based material or a polymer-based material. The organic encapsulation layer 320 may include polyethylene terephthalate, polyethylene naphthalate, polycarbonate, polyimide, polyethylene sulfonate, polyoxymethylene, polyarylate, HMDSO, acrylic-based resin (for example, poly (methyl methacrylate), polyacrylic acid, etc.), or any combination thereof.

The organic encapsulation layer 320 may be formed by applying a monomer having flowability, and then curing a monomer layer with heat or light, such as ultraviolet rays. Alternatively, the organic encapsulation layer 320 may be formed by applying the above polymer-based material.

The touch unit TU may be arranged on the thin film encapsulation layer TFE. The touch unit TU may include the first and second sub-conductive layers CTL1 and CTL2, a first insulating layer 410, and the second insulating layer 420. The first sub-conductive layer CTL1 and the second sub-conductive layer CTL2 may be arranged under and/or on the second insulating layer 420. The first sub-conductive layer CTL1 and the second sub-conductive layer CTL2 may be connected to each other via a contact hole defined in the second insulating layer 420. The first sensing electrode SP1 and the second sensing electrode SP2 described above with reference to FIGS. 7A and 7B may each have a two-layer structure of the first sub-conductive layer CTL1 and the second sub-conductive layer CTL2 connected to each other via a contact hole, as shown in FIG. 8.

The first sub-conductive layer CTL1 and the second sub-conductive layer CTL2 may include a metal layer or a transparent conductive layer. The metal layer may include molybdenum (Mo), magnesium (Mg), silver (Ag), titanium (Ti), copper (Cu), aluminum (Al), and an alloy thereof. The transparent conductive layer may include transparent conductive oxide such as indium tin oxide (ITO), indium zinc oxide (IZO), zinc oxide (ZnO), indium tin zinc oxide (ITZO), etc. In addition, the transparent conductive layer may include a conductive polymer, such as PEDOT, metal nanowire, carbon nanotube, graphene, etc. In an exemplary embodiment, the first sub-conductive layer CTL1 and the second sub-conductive layer CTL2 may each have a three-layer structure of a titanium layer, an aluminum layer, and a titanium layer.

The first insulating layer 410 may be arranged on the thin film encapsulation layer TFE of the display area DA, and the second insulating layer 420 having a first opening OP1 exposing at least a portion of the first insulating layer 410 may be arranged on the first insulating layer 410. The first opening OP1 in the second insulating layer 420 may overlap an emission area EA. A body portion of the second insulating layer 420 defining the first opening OP1 may overlap a body portion of the pixel-defining layer 180. The first insulating layer 410 and the second insulating layer 420 may include an organic material. An organic layer 450 described below may directly contact an upper surface 410A of the first insulating layer 410 via the first opening OP1 defined in the second insulating layer 420.

A side surface of the second insulating layer 420 may have a slope. More particularly, an inner side surface of the first opening OP1 defined in the second insulating layer 420 may have a slope tapered forward with respect to the upper surface 410A of the first insulating layer 410. A tilt angle between the upper surface 410A of the first insulating layer 410 and the side surface of the second insulating layer 420 may be at least about 70 degrees. Because the side surface of the second insulating layer 420 has a slope tapered forward with respect to the upper surface 410A of the first insulating layer 410, a width of the first opening OP1 may gradually increase away from the substrate 100 in a direction perpendicular to an upper surface of the substrate 100 (e.g., direction z). A width of an upper portion of the first opening OP1 may be greater than that of a lower portion of the first opening OP1.

In an exemplary embodiment, the display apparatus may include a first partition wall PW1 arranged on the thin film encapsulation layer TFE of the non-display area NDA along the periphery of the display area DA. The organic layer 450 may cover the touch unit TU and may extend to the first partition wall PW1. More particularly, the organic layer 450 may be arranged on the second insulating layer 420 of the display area DA and extend to the non-display area NDA. The organic layer 450 may include a material having a high refractive index, for example, an organic material having a high refractive index, and may include inorganic particles, such as zirconium oxide ($ZrO_2$), titanium dioxide ($TiO_2$), etc. When the organic layer 450 includes inorganic particles, a refractive index of the organic layer 450 may be increased. In an exemplary embodiment, the second insulating layer 420 may have a first refractive index, and the organic layer 450 may have a second refractive index that is greater than the first refractive index. For example, the first refractive index may be equal to or greater than 1.5 and less than or equal to 1.55, and the second refractive index may be equal to or greater than 1.65 and less than or equal to 1.74.

The organic layer 450 may be arranged on the second insulating layer 420 by an inkjet process. The organic layer 450 may be arranged on the second insulating layer 420 and directly contact the upper surface 410A of the first insulating layer 410 exposed by the first opening OP1 defined in the second insulating layer 420.

The first partition wall PW1 may include a first layer 411 disposed on the thin film encapsulation layer TFE and a second layer 421 disposed on the first layer 411. In an exemplary embodiment, the first layer 411 may include the same material as the first insulating layer 410, and the second layer 421 may include the same material as the second insulating layer 420.

In an exemplary embodiment, the display apparatus may further include a second partition wall PW2 arranged in the non-display area NDA. The second partition wall PW2 may be spaced apart from the first partition wall PW1, arranged on the thin film encapsulation layer TFE, and be arranged between the first partition wall PW1 and the display area DA along the periphery of the display area DA. The second partition wall PW2 may include an organic material.

In an exemplary embodiment, the display apparatus may further include a second opening OP2 between the first partition wall PW1 and the second partition wall PW2, which exposes at least a portion of an upper surface of the thin film encapsulation layer TFE. The organic layer 450 arranged in the non-display area NDA may directly contact the upper surface of the thin film encapsulation layer TFE exposed by the second opening OP2. More particularly, the thin film encapsulation layer TFE may include the first inorganic encapsulation layer 310, the organic encapsulation layer 320, and the second inorganic encapsulation layer 330 sequentially stacked on one another, and the organic layer 450 arranged in the non-display area NDA may directly contact the second inorganic encapsulation layer 330 exposed by the second opening OP2. The first inorganic encapsulation layer 310 and the second inorganic encapsulation layer 330 may include an inorganic material, and the organic encapsulation layer 320 may include an organic material.

As a thickness of the organic layer 450 arranged on the touch unit TU increases, transmittance may be decreased, thereby degrading the efficiency of light emitted from the organic light-emitting diode OLED.

According to one or more exemplary embodiments, the organic layer 450 may be thinly arranged in the display area DA by improving spreadability of the organic layer 450 based on the principle that spreadability is improved between materials having hydrophilicity, and the organic layer 450 may be prevented from overflowing the substrate 100 in the non-display area NDA by controlling spreadability of the organic layer 450 based on the principle that spreadability is controlled between materials having hydrophilicity and hydrophobicity.

Accordingly, in the display area DA, the first insulating layer 410 having hydrophilicity may be arranged under the organic layer 450 having hydrophilicity to bring the organic layer 450 and the first insulating layer 410 into direct contact with each other, and thus, the organic layer 450 may be thinly arranged by improving spreadability of the organic layer 450. In the non-display area NDA, the second inorganic encapsulation layer 330 having hydrophobicity may be arranged under the organic layer 450 having hydrophilicity to bring the organic layer 450 and the second inorganic encapsulation layer 330 into direct contact with each other, and thus, the organic layer 450 may be formed between the first partition wall PW1 and the second partition wall PW2 by controlling spreadability of the organic layer 450. In this regard, the first insulating layer 410 may directly contact the organic layer 450 via the first opening OP1 defined in the second insulating layer 420, and the second inorganic encapsulation layer 330 may directly contact the organic layer 450 via the second opening OP2 formed between the first partition wall PW1 and the second partition wall PW2.

According to one or more exemplary embodiments, the organic layer 450 may be thinly arranged on the touch unit TU by improving spreadability of the organic layer 450, and thus, transmittance of the organic layer 450 may be increased, and the efficiency of light emitted from the organic light-emitting diode OLED may also be increased.

Figure 9:
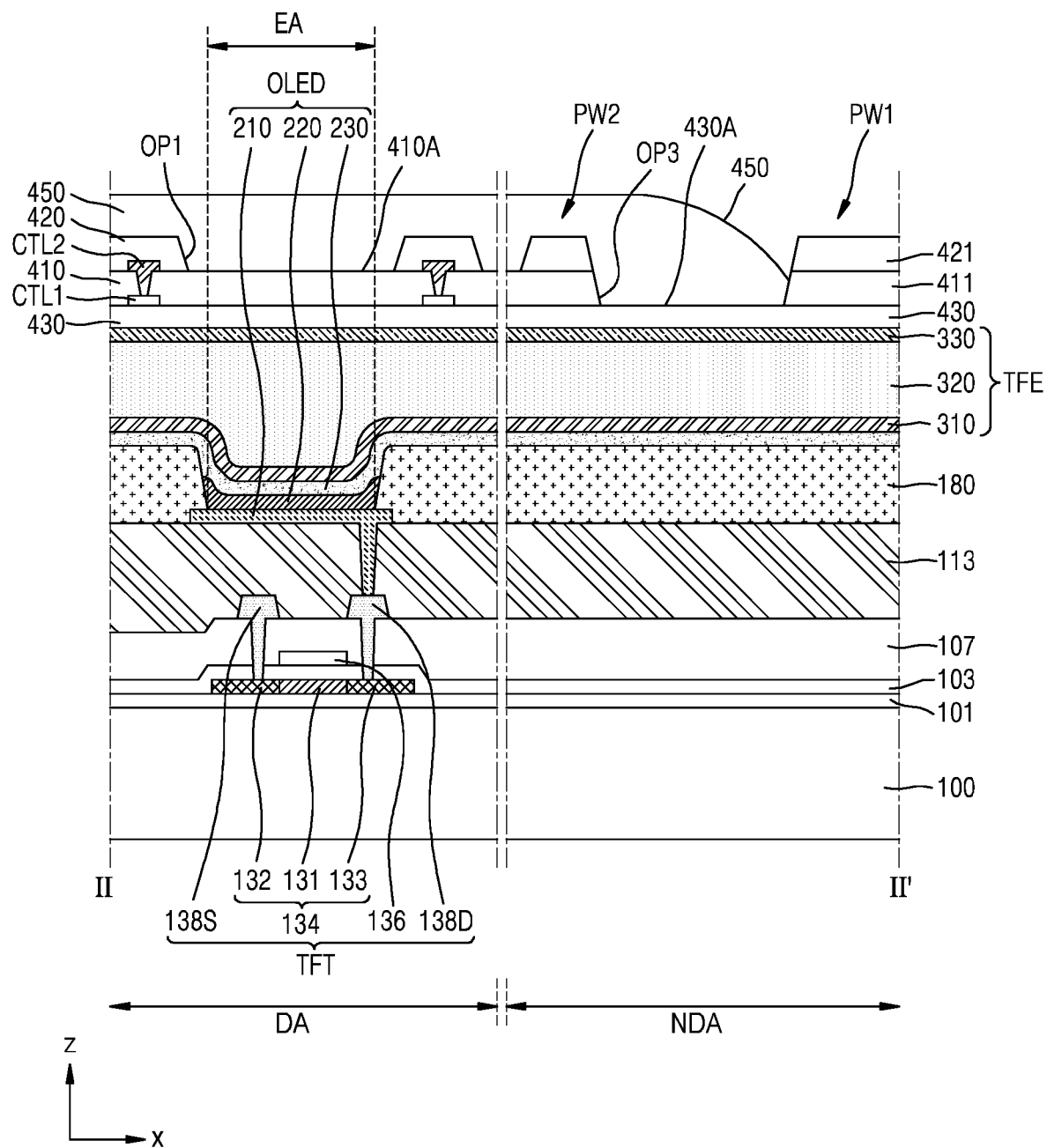
FIG. 9 is a cross-sectional view of a display apparatus according to an exemplary embodiment.

FIG. 9 is a cross-sectional view of a display apparatus according to an exemplary embodiment.

The display apparatus of FIG. 9 is different from the display apparatus of FIG. 8, in that a third insulating layer 430 is arranged between the thin film encapsulation layer TFE and the first insulating layer 410. As such, hereinafter, repeated descriptions as to substantially the same components of the display apparatus already described above will be omitted, and differences will be mainly described below.

Referring to FIG. 9, the touch unit TU may further include the third insulating layer 430 directly arranged on the thin film encapsulation layer TFE, and the third insulating layer 430 may extend to the non-display area NDA. The third insulating layer 430 extending to the non-display area NDA may be directly arranged on the thin film encapsulation layer TFE of the non-display area NDA. The third insulating layer 430 may be arranged between the thin film encapsulation layer TFE and the first insulating layer 410. In an exemplary embodiment, the first insulating layer 410 and the second insulating layer 420 may include an organic material, and the third insulating layer 430 may include an inorganic material.

In an exemplary embodiment, the display apparatus may include the first partition wall PW1 arranged in the non-display area NDA along the periphery of the display area DA. More particularly, the display apparatus may include the first partition wall PW1 arranged on the third insulating layer 430 along the periphery of the display area DA. The organic layer 450 may cover the touch unit TU arranged in the display area DA, and may extend to the first partition wall PW1. More particularly, the organic layer 450 may be arranged on the second insulating layer 420 of the display area DA and extend to the non-display area NDA. The organic layer 450 may be arranged on the second insulating layer 420 by an inkjet process, for example. The organic layer 450 may be arranged on the second insulating layer 420, and directly contact the upper surface 410A of the first insulating layer 410 exposed by the first opening OP1 defined in the second insulating layer 420.

In an exemplary embodiment, the display apparatus may further include the second partition wall PW2 arranged in the non-display area NDA. The second partition wall PW2 may be spaced apart from the first partition wall PW1, and be arranged between the first partition wall PW1 and the display area DA along the periphery of the display area DA. The second partition wall PW2 may include an organic material.

In an exemplary embodiment, the display apparatus may further include a third opening OP3 between the first partition wall PW1 and the second partition wall PW2. The third opening OP3 may expose at least a portion of an upper surface 430A of the third insulating layer 430. The organic layer 450 arranged in the non-display area NDA may directly contact the upper surface 430A of the third insulating layer 430 exposed by the third opening OP3.

In the display area DA, the first insulating layer 410 having hydrophilicity may be arranged under the organic layer 450 having hydrophilicity to bring the organic layer 450 and the first insulating layer 410 into direct contact with each other, and thus, the organic layer 450 may be thinly arranged by improving spreadability of the organic layer 450. In the non-display area NDA, the third insulating layer 430 having hydrophobicity may be arranged under the organic layer 450 having hydrophilicity to bring the organic layer 450 and the third insulating layer 430 into direct contact with each other, and thus, the organic layer 450 may be formed between the first partition wall PW1 and the second partition wall PW2 by controlling spreadability of the organic layer 450. In this regard, the first insulating layer 410 may directly contact the organic layer 450 via the first opening OP1 defined in the second insulating layer 420, and the third insulating layer 430 may directly contact the organic layer 450 via the third opening OP3 formed between the first partition wall PW1 and the second partition wall PW2.

According to one or more exemplary embodiments, the organic layer 450 may be thinly arranged on the touch unit TU by improving spreadability of the organic layer 450, and thus, transmittance of the organic layer 450 may be increased, and the efficiency of light emitted from the organic light-emitting diode OLED may also be increased.

Figure 10:
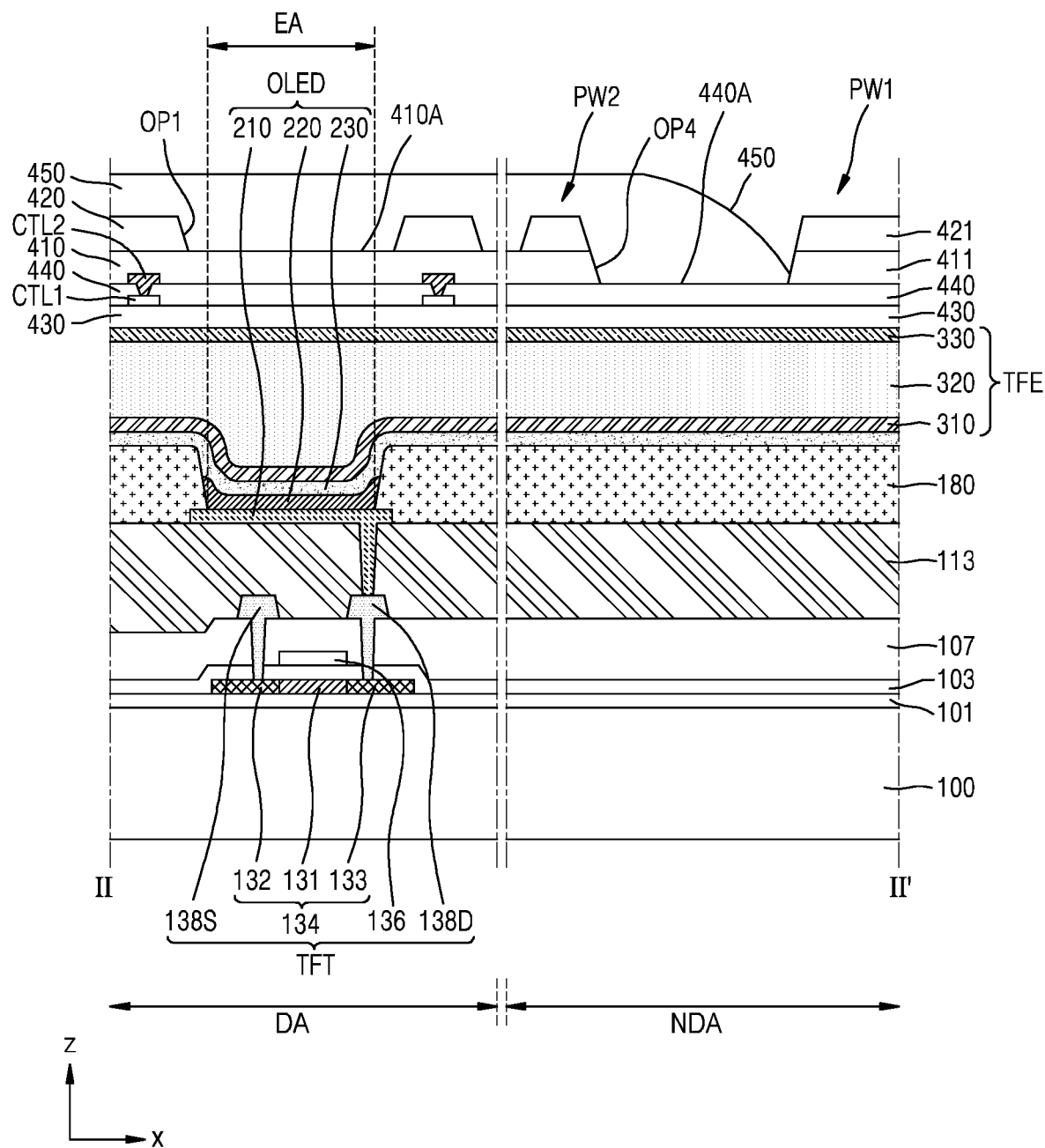
FIG. 10 is a cross-sectional view of a display apparatus according to an exemplary embodiment.

FIG. 10 is a cross-sectional view of a display apparatus according to an exemplary embodiment.

The display apparatus of FIG. 10 is different from the display apparatus of FIG. 9, in that a fourth insulating layer 440 is arranged between the first insulating layer 410 and the third insulating layer 430. As such, hereinafter, repeated descriptions of substantially the components of the display apparatus already described above will be omitted, and differences will be mainly described below.

Referring to FIG. 10, the touch unit TU may further include the fourth insulating layer 440 arranged on the third insulating layer 430, and the fourth insulating layer 440 may extend to the non-display area NDA. The fourth insulating layer 440 extending to the non-display area NDA may be directly arranged on the third insulating layer 430 in the non-display area NDA. The fourth insulating layer 440 may be arranged between the first insulating layer 410 and the third insulating layer 430. In an exemplary embodiment, the first insulating layer 410 and the second insulating layer 420 may include an organic material, and the fourth insulating layer 440 may include an inorganic material.

In an exemplary embodiment, the display apparatus may include the first partition wall PW1 arranged over the non-display area NDA along the periphery of the display area DA. More particularly, the display apparatus may include the first partition wall PW1 arranged on the fourth insulating layer 440 along the periphery of the display area DA. The organic layer 450 may cover the touch unit TU arranged over the display area DA and may extend to the first partition wall PW1. More particularly, the organic layer 450 may be arranged on the second insulating layer 420 of the display area DA and extend to the non-display area NDA. The organic layer 450 may be arranged on the second insulating layer 420 by an inkjet process, for example. The organic layer 450 may be arranged on the second insulating layer 420 and directly contact the upper surface 410A of the first insulating layer 410 exposed by the first opening OP1 defined in the second insulating layer 420.

In an exemplary embodiment, the display apparatus may further include the second partition wall PW2 arranged over the non-display area NDA. The second partition wall PW2 may be spaced apart from the first partition wall PW1 and be arranged between the first partition wall PW1 and the display area DA along the periphery of the display area DA. The second partition wall PW2 may include an organic material.

In an exemplary embodiment, the display apparatus may further include a fourth opening OP4 between the first partition wall PW1 and the second partition wall PW2. The fourth opening OP4 may expose at least a portion of an upper surface 440A of the fourth insulating layer 440. The organic layer 450 arranged over the non-display area NDA may directly contact the upper surface 440A of the fourth insulating layer 440 exposed by the fourth opening OP4.

In the display area DA, the first insulating layer 410 having hydrophilicity may be arranged under the organic layer 450 having hydrophilicity to bring the organic layer 450 and the first insulating layer 410 into direct contact with each other, and thus, the organic layer 450 may be thinly arranged by improving spreadability of the organic layer 450. In the non-display area NDA, the fourth insulating layer 440 having hydrophobicity may be arranged under the organic layer 450 having hydrophilicity to bring the organic layer 450 and the fourth insulating layer 440 into direct contact with each other, and thus, the organic layer 450 may be formed between the first partition wall PW1 and the second partition wall PW2 by controlling spreadability of the organic layer 450. In this regard, the first insulating layer 410 may directly contact the organic layer 450 via the first opening OP1 defined in the second insulating layer 420, and the fourth insulating layer 440 may directly contact the organic layer 450 via the fourth opening OP4 formed between the first partition wall PW1 and the second partition wall PW2.

According to one or more exemplary embodiments, the organic layer 450 may be thinly arranged on the touch unit TU by improving spreadability of the organic layer 450, and thus, transmittance of the organic layer 450 may be increased, and the efficiency of light emitted from the organic light-emitting diode OLED may also be increased.

Figure 11:
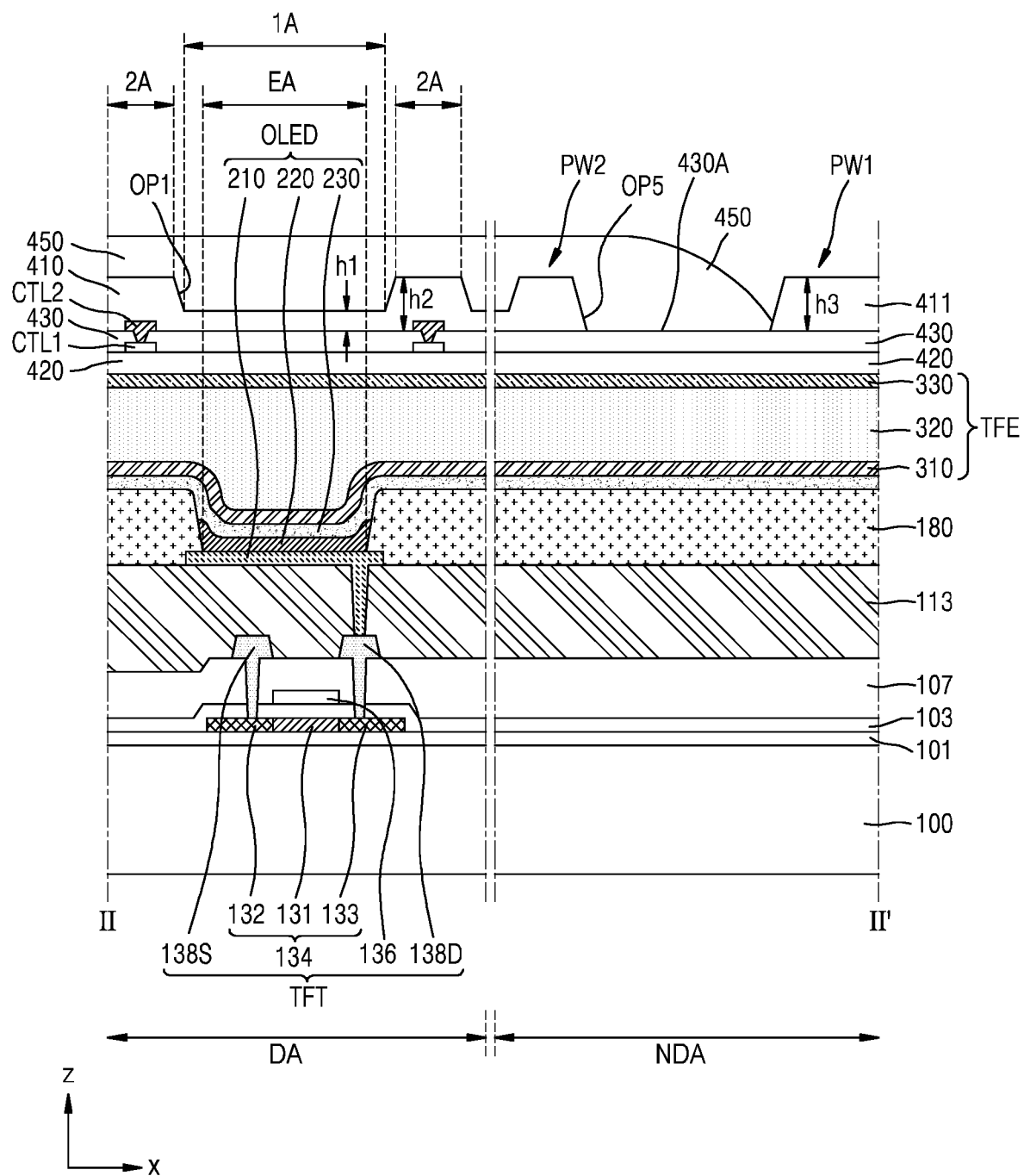
FIG. 11 is a cross-sectional view of a display apparatus according to an exemplary embodiment.

FIG. 11 is a cross-sectional view of a display apparatus according to an exemplary embodiment.

The display apparatus of FIG. 11 is different from the display apparatus of FIG. 10, in that processes may be simplified by depositing the first insulating layer 410 with a halftone mask. As such, hereinafter, repeated descriptions of substantially the same components of the display apparatus already described above will be omitted, and differences will be mainly described below.

Referring to FIG. 11, the touch unit TU may be arranged on the thin film encapsulation layer TFE of the display area DA. The touch unit TU may include the first insulating layer 410, the second insulating layer 420 arranged between the first insulating layer 410 and the thin film encapsulation layer TFE, and the third insulating layer 430 arranged between the first insulating layer 410 and the second insulating layer 420.

In an exemplary embodiment, the first insulating layer 410 may be arranged over the thin film encapsulation layer TFE by using a halftone mask. In the illustrated exemplary embodiment of FIG. 11, when the first insulating layer 410 may be deposited by using a halftone mask, manufacturing processes may be simplified.

The first insulating layer 410 may include a first portion 1A having a first height h1 from an upper surface of the third insulating layer 430 arranged under the first insulating layer 410, and a second portion 2A having a second height h2 from the upper surface of the third insulating layer 430. The second height h2 may be greater than the first height h1. In an exemplary embodiment, the first portion 1A may correspond to the emission area EA. The first insulating layer 410 may include the first opening OP1. For example, the first opening OP1 defined in the first insulating layer 410 may correspond to the first portion 1A.

The second insulating layer 420 arranged between the first insulating layer 410 and the thin film encapsulation layer TFE, and the third insulating layer 430 arranged between the first insulating layer 410 and the second insulating layer 420, may extend to the non-display area NDA. For example, the second insulating layer 420 may be arranged on the thin film encapsulation layer TFE arranged over the non-display area NDA, and the third insulating layer 430 may be arranged on the second insulating layer 420. The first insulating layer 410 may include an organic material, and the third insulating layer 430 may include an inorganic material.

In an exemplary embodiment, the first partition wall PW1 may be arranged over the thin film encapsulation layer TFE of the non-display area NDA along the periphery of the display area DA. The first partition wall PW1 may be directly arranged on the third insulating layer 430 extending from the display area DA. The first partition wall PW1 may include the first layer 411 arranged on the third insulating layer 430 extending to the non-display area NDA. The first layer 411 may include the same material as the first insulating layer 410. The first partition wall PW1 may have a third height h3 from the upper surface 430A of the third insulating layer 430. The third height h3 may be substantially the same as the second height h2.

The organic layer 450 may be arranged on the first insulating layer 410 of the display area DA. The organic layer 450 may cover the touch unit TU and may extend to the first partition wall PW1 of the non-display area NDA.

In an exemplary embodiment, the display apparatus may further include the second partition wall PW2 arranged over the non-display area NDA. The second partition wall PW2 may be spaced apart from the first partition wall PW1, and be arranged between the first partition wall PW1 and the display area DA along the periphery of the display area DA. The second partition wall PW2 may include an organic material.

In an exemplary embodiment, the display apparatus may further include a fifth opening OP5 between the first partition wall PW1 and the second partition wall PW2. The fifth opening OP5 may expose at least a portion of the upper surface 430A of the third insulating layer 430. The organic layer 450 arranged over the non-display area NDA may directly contact the upper surface 430A of the third insulating layer 430 exposed by the fifth opening OP5.

In the display area DA, the first insulating layer 410 having hydrophilicity may be arranged under the organic layer 450 having hydrophilicity to bring the organic layer 450 and the first insulating layer 410 into direct contact with each other, and thus, the organic layer 450 may be thinly arranged by improving spreadability of the organic layer 450. In the non-display area NDA, the third insulating layer 430 having hydrophobicity may be arranged under the organic layer 450 having hydrophilicity to bring the organic layer 450 and the third insulating layer 430 into direct contact with each other, and thus, the organic layer 450 may be formed between the first partition wall PW1 and the second partition wall PW2 by controlling spreadability of the organic layer 450. In this regard, the first insulating layer 410 may be directly arranged under the organic layer 450, and the first insulating layer 410 and the organic layer 450 may directly contact each other, and the third insulating layer 430 may directly contact the organic layer 450 via the fifth opening OP5 formed between the first partition wall PW1 and the second partition wall PW2.

According to one or more exemplary embodiments, the organic layer 450 may be thinly arranged on the touch unit TU by improving spreadability of the organic layer 450, and thus, transmittance of the organic layer 450 may be increased, and the efficiency of light emitted from the organic light-emitting diode OLED may also be increased.

According to the exemplary embodiments, a first insulating layer and a second insulating layer of a functional layer disposed on a thin film encapsulation layer may be used, and accordingly, processes may be simplified by decreasing the number of layers. Also, as the number of layers decreases, optical functions until light emitted from a display element is visible to an external user, for example, transmittance of the display apparatus itself, may be improved. Also, spreadability may be improved or controlled by using properties of hydrophilicity and hydrophobicity, and thus, transmittance of a display apparatus may be increased.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising:
   a substrate including a display area and a non-display area adjacent to the display area;

a thin film encapsulation layer disposed on the substrate and including at least one inorganic encapsulation layer and at least one organic encapsulation layer;

a touch unit disposed on the thin film encapsulation layer in the display area, and including a first insulating layer and a second insulating layer disposed on the first insulating layer, the second insulating layer having a first opening at least partially exposing the first insulating layer;

a first partition wall disposed on the thin film encapsulation layer in the non-display area along a periphery of the display area; and an organic layer covering the touch unit, directly contacting an upper surface of the first insulating layer through the first opening, and extending to the first partition wall.

2. The display apparatus of claim 1, wherein:
the second insulating layer has a first refractive index; and
the organic layer has a second refractive index greater than the first refractive index.

3. The display apparatus of claim 2, wherein the first insulating layer and the second insulating layer comprise an organic material.

4. The display apparatus of claim 3, wherein:
the first partition wall includes a first layer disposed on the thin film encapsulation layer and a second layer disposed on the first layer; and
the first layer comprises the same material as the first insulating layer, and the second layer comprises the same material as the second insulating layer.

5. The display apparatus of claim 4, further comprising:
a second partition wall spaced apart from the first partition wall and disposed between the first partition wall and the display area along the periphery of the display area; and
a second opening between the first partition wall and the second partition wall, the second opening exposing at least a portion of an upper surface of the thin film encapsulation layer,
wherein the organic layer disposed over the non-display area directly contacts the upper surface of the thin film encapsulation layer through the second opening.

6. The display apparatus of claim 5, wherein:
the thin film encapsulation layer comprises a first inorganic encapsulation layer, an organic encapsulation layer, and a second inorganic encapsulation layer sequentially stacked one over another; and
the organic layer disposed in the non-display area directly contacts the second inorganic encapsulation layer through the second opening.

7. The display apparatus of claim 1, wherein an inner side surface of the first opening has a slope tapered forward with respect to the upper surface of the first insulating layer.

8. The display apparatus of claim 1, wherein the touch unit further includes a conductive layer comprising sensing electrodes.

9. The display apparatus of claim 1, wherein:
the touch unit further includes a third insulating layer disposed directly on the thin film encapsulation layer; and
the third insulating layer extends to the non-display area and is disposed on the thin film encapsulation layer in the non-display area.

10. The display apparatus of claim 9, wherein the first insulating layer and the second insulating layer comprise an organic material, and the third insulating layer comprises an inorganic material.

11. The display apparatus of claim 9, further comprising:
a second partition wall spaced apart from the first partition wall and disposed between the first partition wall and the display area along the periphery of the display area; and
a third opening between the first partition wall and the second partition wall, the third opening exposing at least a portion of an upper surface of the third insulating layer.

12. The display apparatus of claim 11, wherein the organic layer disposed in the non-display area directly contacts the upper surface of the third insulating layer through the third opening.

13. The display apparatus of claim 9, wherein:
the touch unit further includes a fourth insulating layer disposed on the third insulating layer; and
the fourth insulating layer extends to the non-display area and is disposed on the third insulating layer in the non-display area.

14. The display apparatus of claim 13, wherein the first insulating layer and the second insulating layer comprise an organic material, and the fourth insulating layer comprises an inorganic material.

15. The display apparatus of claim 14, further comprising:
a second partition wall spaced apart from the first partition wall and disposed between the first partition wall and the display area along the periphery of the display area; and
a fourth opening between the first partition wall and the second partition wall,
wherein the fourth opening exposes at least a portion of an upper surface of the fourth insulating layer.

16. The display apparatus of claim 15, wherein the organic layer disposed in the non-display area directly contacts the upper surface of the fourth insulating layer through the fourth opening.

17. A display apparatus comprising:
a substrate including a display area and a non-display area adjacent to the display area;
a thin film encapsulation layer disposed on the substrate and including at least one inorganic encapsulation layer and at least one organic encapsulation layer;
a touch unit disposed on the thin film encapsulation layer in the display area and including a first insulating layer, a second insulating layer disposed between the first insulating layer and the thin film encapsulation layer, and a third insulating layer disposed between the first insulating layer and the second insulating layer;
a first partition wall disposed on the thin film encapsulation layer in the non-display area along a periphery of the display area; and
an organic layer covering the touch unit and extending to the first partition wall,
wherein the first insulating layer includes a first portion having a first height from an upper surface of the third insulating layer and a second portion having a second height from the upper surface of the third insulating layer,
wherein the first portion and the second portion are disposed in the display area and are each defined as an area from a top surface to a bottom surface of the first insulation layer, and
wherein the second height is greater than the first height.

18. The display apparatus of claim 17, wherein:
the second insulating layer and the third insulating layer extend to the non-display area; and the first insulating layer comprises an organic material, and the third insulating layer comprises an inorganic material.

19. The display apparatus of claim 18, wherein:

the first partition wall includes a first layer disposed on the third insulating layer and extending to the non-display area;

the first layer comprises the same material as the first insulating layer; and the first partition wall has a third height from the upper surface of the third insulating layer, the third height being the same as the second height.

20. The display apparatus of claim 17, wherein the first portion overlaps an emission area.

* * * * *